US012604669B2

(12) United States Patent
Chen et al.

(10) Patent No.: US 12,604,669 B2
(45) Date of Patent: Apr. 14, 2026

(54) SPIN-ORBIT TORQUE MEMORY DEVICES

(71) Applicant: International Business Machines Corporation, Armonk, NY (US)

(72) Inventors: Ching-Tzu Chen, Ossining, NY (US); Henry K. Utomo, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 436 days.

(21) Appl. No.: 18/124,913

(22) Filed: Mar. 22, 2023

(65) Prior Publication Data

US 2024/0324468 A1     Sep. 26, 2024

(51) Int. Cl.
| | |
|---|---|
| *H10N 50/10* | (2023.01) |
| *H01L 23/522* | (2006.01) |
| *H01L 23/528* | (2006.01) |
| *H10B 61/00* | (2023.01) |

(52) U.S. Cl.
CPC ......... *H10N 50/10* (2023.02); *H01L 23/5226* (2013.01); *H01L 23/5283* (2013.01); *H10B 61/22* (2023.02)

(58) Field of Classification Search
CPC .... H10N 50/10; H10B 61/22; H01L 23/5226; H01L 23/5283
USPC ......................................................... 257/421
See application file for complete search history.

(56) References Cited

U.S. PATENT DOCUMENTS

| | | | |
|---|---|---|---|
| 11,367,749 | B2 | 6/2022 | Sato et al. |
| 2009/0261433 | A1 | 10/2009 | Kang et al. |

| | | | |
|---|---|---|---|
| 2013/0001652 | A1 | 1/2013 | Yoshikawa et al. |
| 2018/0106873 | A1* | 4/2018 | Wu ...................... G01R 33/093 |
| 2021/0351342 | A1 | 11/2021 | Yui et al. |
| 2021/0351344 | A1 | 11/2021 | Tseng et al. |
| 2022/0157733 | A1 | 5/2022 | Chen et al. |
| 2022/0216396 | A1 | 7/2022 | Huang et al. |
| 2022/0246189 | A1 | 8/2022 | Chiang et al. |
| 2022/0359614 | A1 | 11/2022 | Lin et al. |
| 2022/0359820 | A1 | 11/2022 | Gallagher |
| 2023/0065198 | A1 | 3/2023 | Young et al. |
| 2024/0113024 | A1 | 4/2024 | Chen et al. |

FOREIGN PATENT DOCUMENTS

| | | |
|---|---|---|
| EP | 3591701 A1 | 1/2020 |
| EP | 3996093 A1 | 5/2022 |
| TW | 201007938 A | 2/2010 |

(Continued)

OTHER PUBLICATIONS

Wang et al. CN 110635024, Contention-based Spin Flow Control Magnetic Random Access Memory And A Preparation Method Thereof (Year: 2019).*

(Continued)

*Primary Examiner* — Tu-Tu V Ho
(74) *Attorney, Agent, or Firm* — Scully, Scott, Murphy & Presser, P.C.

(57) ABSTRACT

Spin-orbit torque magnetoresistive random access memory (SOT MRAM) devices are provided. Each of the SOT MRAM devices integrates a SOT layer and an interconnect layer at a same metal level using a topological conductor (i.e., a topological metal or a topological semimetal) as both the interconnect layer and the SOT layer. The SOT MRAM devices further include a magnetic tunnel junction (MTJ) structure contacting the SOT layer, and a contact structure contacting the MTJ structure.

20 Claims, 6 Drawing Sheets

(56)                   References Cited

FOREIGN PATENT DOCUMENTS

| | | |
|---|---|---|
| TW | 201304070 A | 1/2013 |
| TW | 202444219 A | 11/2024 |
| WO | 2017052542 A1 | 3/2017 |
| WO | 2024/194696 | 9/2024 |

OTHER PUBLICATIONS

Taiwan Patent Office, "Office Action," Jan. 21, 2025, 10 Pages, TW Application No. 113101354.

Yanez, W., et al., "Giant Dampinglike-Torque Efficiency in Naturally Oxidized Polycrystalline TaAs Thin Films", Physical Review Applied, Nov. 2022, 11 pages. 18, 054004.

Sun, Y., et al., "Strong Intrinsic Spin Hall Effect in the TaAs Family of Weyl Semimetals", Physical Review Letters, Sep. 2016, 5 pages, PRL 117, 146403.

Lanzillo, N. A., et al., "Size-Dependent Grain Boundary Scattering in Topological Semimetals", Phys. Rev. Applied, Sep. 2022, 9 pages, 18, 034053.

Leiva, L., et al., "Giant spin Hall angle in the Heusler alloy Weyl ferromagnet Co2MnGa", Physical Review , Jan. 2011. 7 pages, B 103, L041114.

Lien, S.-W., et al., "Unconventional resistivity scaling in topological semimetal CoSi", Quantum Materials, 9 pages, Jan. 10, 2023.

Kumar, S., et al., "Anomalous conductance scaling in Weyl semimetal NbAs", Materials Science, Nov. 2022, 14 pages.

Ding, J., et al., "Switching of a Magnet by Spin-Orbit Torque from a Topological Dirac Semimetal", Adv. Mater., Jun. 2021, 10 pages.

Chen, C.-T., et al., "Topological Semimetals for Scaled Back-End-Of-Line Interconnect Beyond Cu", 2020 IEEE International Electron Devices Meeting (IEDM), Date of Conference: Dec. 12-18, 2020, 4 pages.

Zhou, J., et al., "Intrinsic spin Hall conductivity of the semimetals MoTe2 andWTe2", Physical Review, Feb. 2019, 5 pages, 99.

Liao, Y.-C., et al., "Benchmarking and Optimization of Spintronic Memory Arrays", IEEE Journal on Exploratory Solid-State Computational Devices and Circuits, Jun. 2020, pp. 9-17, vol. 6, No. 1.

Liu, Y., et al., "Two-Dimensional Materials for Energy-Efficient Spin-Orbit Torque Devices", ACS NANO, Aug. 25, 2020, pp. 9389-9407, vol. 14, No. 8.

International Search Report dated May 6, 2024, received in a corresponding foreign application, 14 pages.

Tsai, C.-I., et al., "Cobalt Silicide Nanostructures: Synthesis, Electron Transport, and Field Emission Properties", Crystal Growth & Design, Aug. 15, 2009, pp. 4514-4518, vol. 9, No. 10.

Sadowski, J., et al., "Structural Properties of TaAs Weyl Semimetal Thin Films Grown by Molecular Beam Epitaxy on GaAs(001) Substrates", Cryst. Growth Des., Sep. 22, 2022 pp. 6039-6045, 22.

Zhang, C., et al., "Ultrahigh conductivity in Weyl semimetal NbAs nanobelts", Nature Materials, May 2019, pp. 482-488, vol. 18.

Yanez, W. J., et al., "Charge to spin conversion in the Weyl semimetal NbAs", APS—Mid-Atlantic Section 2022 Meeting, Bulletin of the American Physical Society, 1 page, Abstract only.

Kumar, N., et al., "Extremely high conductivity observed in the triple point topological metal MoP", Nature Communications, Jun. 2019, 7 pages, 10.

Lien, S.-W., et al., "Unconventional resistivity scaling in topological semimetal CoSi", npj Quantum Materials, Jan. 2023, 9 pages, 8.

* cited by examiner

SPIN-ORBIT TORQUE MEMORY DEVICES

BACKGROUND

The present application relates to memory devices, and more particularly to spin-orbit torque (SOT) magnetoresistive random access memory (MRAM) devices.

MRAM is a non-volatile random access memory technology in which data is stored by magnetic storage elements. These elements are typically formed from two ferromagnetic plates, each of which can hold a magnetization, separated by a thin dielectric layer (i.e., a tunnel barrier layer). One of the two plates (i.e., the magnetic reference or pinned layer) is a magnet whose magnetic moment direction is set to a particular direction; the other plate's (i.e., the magnetic free layer's) magnetization can be changed in at least two different directions, representing different digital states such as 0 and 1 for memory applications. In MRAMs, such elements may be referred to as a magnetic tunnel junction (MTJ) structure. In a typical MTJ structure, the magnetization of the magnetic reference layer is fixed in one direction (say pointing up), while the direction of the magnetic free layer can be "switched" by some external forces, such as a magnetic field or a spin-torque generating charge current. A smaller current (of either polarity) can be used to read the resistance of the device, which depends on the relative orientations of the magnetizations of the magnetic free layer and the magnetic reference layer. The resistance is typically higher when the magnetizations are anti-parallel, and lower when they are parallel (though this can be reversed, depending on the material).

One type of MRAM that can use a MTJ structure is spin-transfer torque (STT) MRAM. STT MRAM has the advantages of lower power consumption and better scalability over conventional MRAM which uses magnetic fields to flip the active elements. In STT MRAM, spin-transfer torque is used to flip (switch) the orientation of the magnetic free layer. For an STT MRAM device, a current passing through the MTJ structure is used to switch, or "write" the bit-state of the MTJ memory element. A current passing down through the MTJ structure makes the magnetic free layer parallel to the magnetic reference layer, while a current passed up through the MTJ structure makes the magnetic free layer anti-parallel to the magnetic reference layer.

Another type of MRAM that can use a MTJ structure is SOT MRAM device. SOT memory devices do not require passing of high current through the MTJ structure during the write operation, which is done by a current flowing through the SOT layer. SOT memory devices are actively being considered as a beyond STT MRAM option for reducing write current and eliminating read disturb. Existing SOT MRAM devices include an SOT layer of a different material from the interconnect metals (for write) and an MTJ structure integrated above (for read). The SOT layer connects to one of the metal interconnect layers (e.g., a first metal level, M1) through a SOT via layer. Thus, in addition to patterning the metal interconnect and the SOT layer, the SOT via layer must also be patterned. Also, the SOT layer and SOT via become a limiting factor for inserting the SOT MRAM devices between lower metal interconnect layers in advanced nodes to gain density and reduce parasitic resistance.

SUMMARY

SOT MRAM devices for use in a structure are provided. Each of the SOT MRAM devices of the present application integrates a SOT layer and an interconnect layer at a same metal level using a topological conductor (i.e., a topological metal or a topological semimetal) as both the interconnect layer and the SOT layer. The SOT MRAM devices further include a MTJ structure contacting the SOT layer, and a MTJ contact structure contacting the MTJ structure. Using topological conductors as both the interconnect layer and SOT layer can absorb the SOT layer into the interconnect layer and eliminate associated SOT via layers, simplifying patterning and allowing to insert the SOT MRAM device at a lower metal level.

In one aspect of the present application, a memory structure is provided. In one embodiment of the present application, the memory structure includes a SOT layer and an interconnect layer located at a same metal level of a back-end-of-the-line (BEOL) structure, wherein both the SOT layer and the interconnect layer are composed of a topological conductor. In the present application, the SOT layer and the interconnect layer are composed of the same topological conductor. The memory structure further includes a MTJ structure including a magnetic free layer forming an interface with the SOT layer, and a MTJ contact structure contacting the MTJ structure.

In some embodiments of the present application, the topological conductor is a material selected from a metal or semimetal, wherein the metal or semimetal has conducting surface states protected by nontrivial bandstructure topologies with the surface conductivity greater than the bulk conductivity of the metal or semimetal. Typically, the surface conductivity of the topological conductor is at least 2× greater than the bulk conductivity.

In some embodiments of the present application, the topological conductor is a Weyl semimetal, a multi-fold fermion semimetal, a magnetic Weyl semimetal, a Kramers-Weyl fermion semimetal or a triple-point topological metal.

In some embodiments of the present application, the MTJ structure includes, from bottom to top, the magnetic free layer, a tunnel barrier layer, a magnetic reference layer, and an electrode layer. In such embodiments, the MTJ structure is located above the SOT layer, but beneath the contact structure.

In some embodiments of the present application, the MTJ structure includes, from bottom to top, an electrode layer, a magnetic reference layer, a tunnel barrier layer and the magnetic free layer. In such embodiments, the MTJ structure is located above the contact structure, but beneath the SOT layer.

In some embodiments of the present application, the MTJ contact structure is composed of an electrically conductive metal, an electrically conductive metal alloy or another topological conductor. When the MTJ contact structure is composed of a topological conductor, the topological conductor can be compositionally the same as, or compositionally different from, the topological conductor that provides the SOT layer and the interconnect layer.

In some embodiments of the present application, the SOT layer and the interconnect layer are spaced apart by an interconnect dielectric layer.

In some embodiments of the present application, the memory structure further includes a SOT contact structure electrically connected to the SOT layer by a via structure.

In some embodiments of the present application, the memory structure further includes a SOT contact structure electrically connected to the SOT layer by a via portion of the SOT contact structure.

In some embodiments of the present application, the SOT contact structure described in the embodiments above includes an electrically conductive metal, an electrically conductive metal alloy or another topological conductor, wherein the another topological conductor is compositionally the same as, or compositionally different, from the topological conductor that provides the SOT layer and the interconnect layer.

In some embodiments of the present application, the memory structure further includes at least one via structure contacting a bottommost surface of the SOT layer.

In some embodiments of the present application, the at least one via structure is composed of an electrically conductive metal, electrically conductive material alloy or another topological conductor, wherein the another topological conductor is compositionally the same as or compositionally different from the topological conductor that provides the SOT layer and the interconnect layer.

In some embodiments of the present application, the SOT layer further includes at least one via portion that is located on a side of the SOT layer that is opposite a side of the SOT layer that contacts the MTJ structure, wherein the SOT layer and the at least one via portion are both composed of the topological conductor.

In some embodiments of the present application, the memory structure further includes a via structure located beneath the interconnect layer.

In some embodiments of the present application, the SOT layer and the interconnect layer are both electrically connected to a source/drain region of a transistor.

In another aspect of the present application, a structure is provided. In one embodiment, the structure includes a memory device region including a memory structure located therein. The memory structure includes a SOT layer and an interconnect layer located at a same metal level of a BEOL structure, wherein both the SOT layer and the interconnect layer are composed of a topological conductor. The memory structure further includes a MTJ structure including a magnetic free layer forming an interface with the SOT layer, and a MTJ contact structure contacting the MTJ structure. In addition to the memory device region, the structure also includes a non-memory device region located adjacent to the memory device region. The non-memory device region includes another interconnect layer, wherein the another interconnect layer is located at the same metal level as both the SOT layer and the interconnect layer, and the another interconnect layer is composed of the topological conductor.

In some embodiments of the structure of the present application, the SOT layer and the interconnect layer are both electrically connected to a source/drain region of a transistor located in the memory device region, and the another interconnect layer is electrically connected to a source/drain region of a transistor located in the non-memory device region.

DETAILED DESCRIPTION

Figure 1:
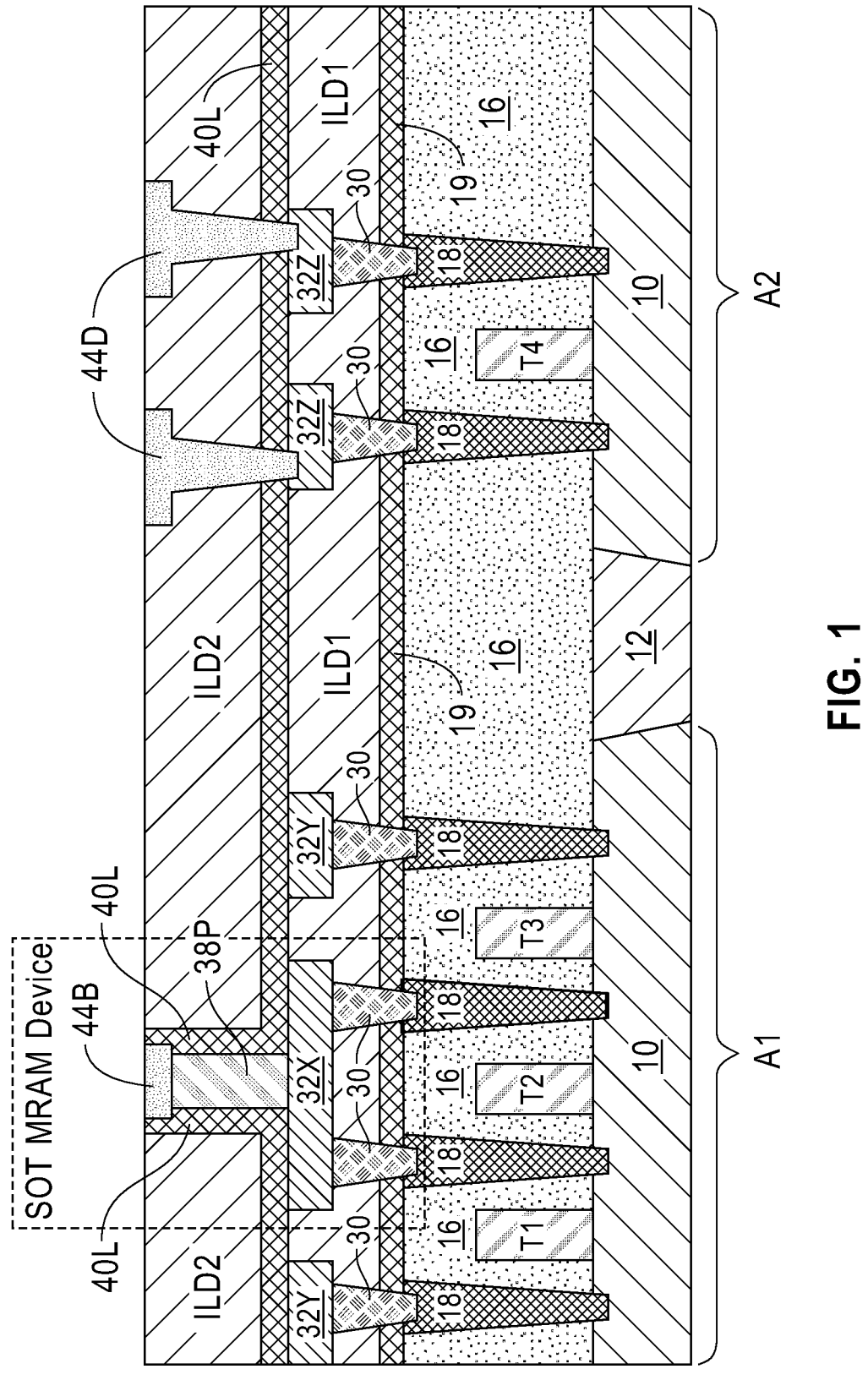
FIG. 1 is a cross sectional view of a structure including a SOT MRAM device in accordance with a first embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As stated above, SOT MRAM devices are provided in the present application. Each of the SOT MRAM devices of the present application integrates a SOT layer and an interconnect layer at a same metal level using a topological conductor (i.e., a topological metal or a topological semimetal) as both the interconnect layer and the SOT layer. By the "same metal level", it is meant that the SOT layer and the interconnect layer are located laterally adjacent to one another and each is in one of M1, M2, M3 . . . . Mn of a BEOL structure. The SOT layer and the interconnect layer typically have at least a topmost surface that is coplanar with each other. The SOT MRAM devices further include a MTJ structure contacting the SOT layer, and a MTJ contact structure contacting the MTJ structure. Using topological conductors as both the interconnect layer and SOT layer can absorb the SOT layer into the interconnect layer and eliminate associated SOT via layers, simplifying patterning and allowing to insert the SOT MRAM device at a lower metal level. These and other aspects of the present application will now be described in greater detail.

Referring first to FIG. 1, there is shown a structure in accordance with an embodiment of the present application. The structure illustrated in FIG. 1 includes a SOT MRAM device in accordance with a first embodiment of the present application that is located in a memory device region, A1. In some embodiments and as is shown in FIG. 1, a non-memory device regions, A2, is located adjacent to the memory device region, A1. In FIG. 1, a box whose perimeter is outlined with doted lines is shown. This boxed region represents an area of the memory device region, A1, which the SOT MRAM device is housed. FIG. 1 shows one type of SOT MRAM device that can be employed. FIGS. 2-5 that follow show other SOT MRAM devices that be used in place of the SOT MRAM device shown in FIG. 1.

Notably, the illustrated structure includes a semiconductor substrate 10; it is noted that FIG. 1 only shows an upper portion of semiconductor substrate 10. The semiconductor substrate 10 can be composed of at least one semiconductor material having semiconductor properties. Illustrative examples of semiconductor materials that can be employed in the present application include, but are not limited to, silicon (Si), a silicon germanium (SiGe) alloy, a silicon germanium carbide (SiGeC) alloy, germanium (Ge), a III/V compound semiconductor, an II/VI compound semiconductor or a multilayered stack including at least two semiconductor materials. In some embodiments, the semiconductor substrate 10 can be a bulk semiconductor substrate (i.e., a substrate that is entirely composed of one or more semiconductor materials). In other embodiments, the semiconductor substrate 10 can be a semiconductor-on-insulator (SOI) substrate. The SOI substrate includes an insulator layer such as, for example, silicon dioxide and/or boron nitride positioned between a first semiconductor material and a second semiconductor material. In one example, the SOI substrate includes Si as the first semiconductor material, silicon dioxide as the insulator, and Si as the second semiconductor material.

The structure shown in FIG. 1 can further include a shallow trench isolation structure 12 (or like insulating structure) located in the semiconductor substrate 10. The shallow trench isolation structure 12 can be used to separate the memory device region, A1, from the non-memory device region, A2. The shallow trench isolation structure 12 is composed of any trench dielectric material such as, for example, silicon oxide. In some embodiments, a trench dielectric liner composed of, for example, silicon nitride, SiN, can be present along a sidewall and a bottom wall of the trench dielectric material. The shallow trench isolation structure 12 can have a topmost surface that is coplanar with a topmost surface of the non-etched portion of the semiconductor substrate 10. The shallow trench isolation structure 12 can be formed by first forming (by lithography and etching) a trench in an upper portion of the semiconductor substrate 10, depositing the optional trench dielectric liner material and the trench dielectric material in the trench, and thereafter performing planarization process or an etch back process.

The structure shown in FIG. 1 further includes a plurality of transistors. In the drawing four transistors, T1, T2, T3 and T4 are shown by way of one example. In the illustrated embodiment, T1, T2 and T3 are located in the memory device region, A1, while T4 is located in the non-memory device region, A2. In the illustrated embodiment, T1 and T3 are both access devices, with T1 serving as a write line transistor of the memory device and T3 severing as a read line transistor of the memory device. T2 is a dummy, i.e., non-active, transistor. T4 can be a logic transistor. Each transistor, for example T1, T2, T3 and T4, is a field effect transistor (FET) that includes a gate dielectric material including, for example, a high-k (k is equal to 4.0 or greater) material, contacting a semiconductor channel (the channel is located between a source region and a drain region of the transistor), and a gate conductor material (including work-function metals) contacting the gate dielectric material. The FETs can be planar transistors and/or non-planar transistors.

Exemplary non-planar transistors include, but are not limited to, stacked FETs, nanosheet FET, or finFETs. The transistors also include source/drain regions (not shown) in FIG. 1. In the illustrated embodiment, the source/drain regions would be located in the semiconductor substrate 10 and at the footprint of each of the transistors. The transistors can be formed utilizing techniques that are well known to those skilled in the art. It is noted that the transistors are present in a front-end-of-the-line (FEOL) level of the structure shown in FIG. 1.

The structure illustrated in FIG. 1 further includes a middle-of-the-line (MOL) dielectric layer 16 that is composed of one or more MOL dielectric materials such as, for example, silicon oxide, silicon nitride, undoped silicate glass (US), fluorosilicate glass (FSG), borophosphosilicate glass (BPSG), a spin-on low-k dielectric, a chemical vapor deposition (CVD) low-k dielectric or any combination thereof. The term "low-k dielectric" as used throughout the present application denotes a dielectric material that has a dielectric constant, k, which is less than 4.0; it is noted that all dielectric constants, k, mentioned herein are relative to a vacuum unless otherwise stated). The MOL dielectric layer 16 can be formed by a deposition process including, but not limited to, CVD, plasma enhanced chemical vapor deposition (PECVD), or spin-on coating. The MOL dielectric layer 16 is formed between and atop each of the transistors, i.e., T1, T2, T3 and T4.

The structure of FIG. 1 further includes a plurality of source/drain contact structures 18. Each source/drain contact structure 18 extends through the MOL dielectric layer 16 and contacts a surface of one of the source/drain regions (not shown) of the underlying transistor. The source/drain contact structures 18 typically have a topmost surface that is coplanar with a topmost surface of the MOL dielectric layer 16. Each source/drain contact structure 18 is composed of a contact conductor material. The contact conductor material can include, for example, a silicide liner, such as TiSi, NiSi, PtSi, NiPtSi, an adhesion metal liner, such as TiN, and conductive metals such as W, Cu, Al, Co, Ru, Mo, Os, Ir, Rh, or an alloy thereof. The source/drain contact structure 18 can also include one or more contact liners (not shown). In one or more embodiments, the contact liner (not shown) can include a diffusion barrier material. Exemplary diffusion barrier materials include, but are not limited to, Ti, Ta, Ni, Co, Pt, W, Ru, TiN, TaN, WN, WC, an alloy thereof, or a stack thereof such as Ti/TiN and Ti/WC. In one or more embodiments in which a contact liner is present, the contact liner (not shown) can include a silicide liner, such as TiSi, NiSi, PtSi, NiPtSi, etc., and a diffusion barrier material, as defined above. The source/drain contact structures 18 can be formed utilizing a metallization process that includes forming contact openings in the MOL dielectric layer 16, and thereafter filling (including deposition and planarization) each contact opening with at least a contact conductor material.

In the present application, the MOL dielectric layer 16, and the source/drain contact structures 18 are present in a MOL level of the structure, which is located atop the FEOL level of the structure.

The structure of FIG. 1 can further include a dielectric capping layer 19 located on the MOL dielectric layer 16. The dielectric capping layer 19 can be omitted in some embodiments of the present application. When present, the dielectric capping layer 19 is composed of a dielectric material having a different composition than the MOL dielectric layer 16. An Illustrative example of a dielectric material that can be used as the dielectric capping layer 19 include, but are not limited to, a dielectric material that contains atoms of silicon, carbon and hydrogen. In some embodiments, and in addition to atoms of carbon and hydrogen, the dielectric material that provides the dielectric capping layer 19 can include atoms of at least one of nitrogen and oxygen. In other embodiments, and in addition to atoms of silicon, nitrogen, carbon and hydrogen, the dielectric material that provides the dielectric capping layer 19 can include atoms of boron. In one example, the dielectric material that provides the dielectric capping layer 19 can be composed of an NBLOK dielectric material that contains atoms of silicon, carbon, hydrogen, nitrogen and oxygen. In alternative example, the dielectric material that provides the dielectric capping layer 19 can be composed of a SiBCN dielectric material that contains atoms of silicon, boron, carbon, hydrogen, and nitrogen. The dielectric capping layer 19 can be formed utilizing a deposition process such, as, for example, CVD, PECVD, atomic layer deposition (ALD) or spin-on coating.

The structure illustrated in FIG. 1 further includes a plurality of via structures 30, a plurality of interconnect layers 32Y and 32Z, and at least one SOT layer 32X. Each of interconnect layers 32Y and 32Z, and at least one SOT layer 32X are present in a first interconnect dielectric layer ILD1. Interconnect layers 32Y and SOT layer 32X are present in the memory device region, A1, while interconnect layers 32Z are present in the non-memory device region, A2. As illustrated, the plurality of interconnect layers 32Y and 32Z, and the at least one SOT layer 32X are all located at a same metal level of the semiconductor structure. The SOT layer 32X is spaced apart from the interconnect layers 32Y that are present in the memory device area, A1, by ILD1. As is shown, one end of each of the via structures 30 is designed to contact one of the underlying source/drain contact structures 18. As is shown, an opposite end of some of the via structures 30 are designed to contact interconnect layers 32Y and 32Z, and an opposite end of at least one of the via structures 30 is designed to contact the SOT layer 32X. The plurality of via structures 30, the plurality of interconnect layers 32Y and 32Z, the least one SOT layer 32X, and the first interconnect dielectric layer ILD1 are formed utilizing various deposition and metallization processes (this aspect of the present application will be described in greater detail herein below in regarding to the process flow illustrated in FIGS. 6A-6K.

The first interconnect dielectric layer ILD1 can be composed of any interconnect dielectric material including, for example, silicon oxide (SiOx), silicon nitride (SiNx), SiCOH, SiNCH, SiCN, SiCNO, SiNCOH, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. The first interconnect dielectric layer ILD1 can have a dielectric constant (all dielectric constants mentioned herein are measured relative to a vacuum, unless otherwise stated) that is about 4.0 or less. In one embodiment, the first interconnect dielectric layer ILD1 has a dielectric constant of 2.8 or less. These dielectrics generally having a lower parasitic cross talk as compared to dielectric materials whose dielectric constant is greater than 4.0.

Figures 2, 3, 4, 5:
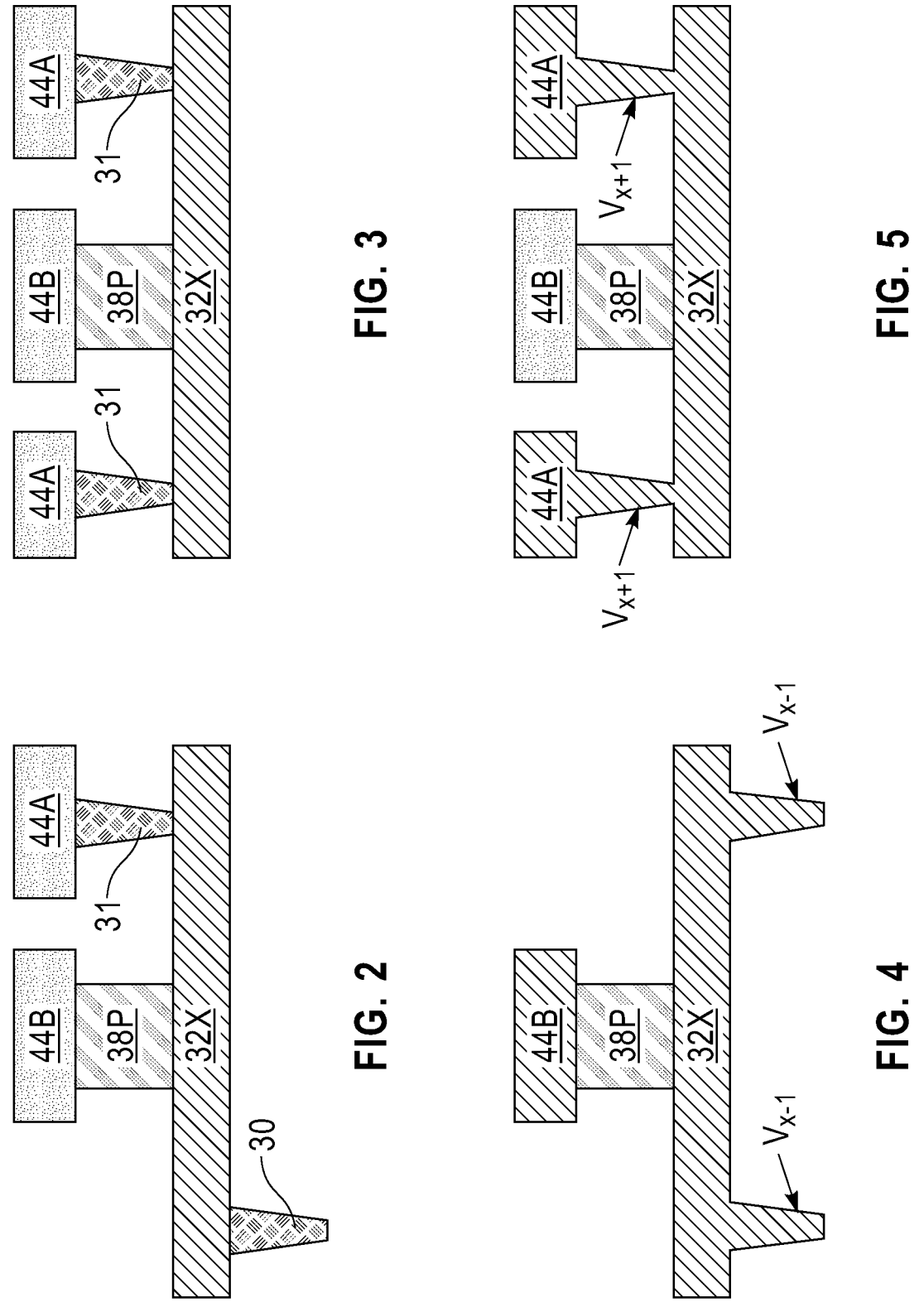
FIG. 2 is a cross sectional view of a SOT MRAM device in accordance with a second embodiment of the present application.
FIG. 3 is a cross sectional view of a SOT MRAM device in accordance with a third embodiment of the present application.
FIG. 4 is a cross sectional view of a SOT MRAM device in accordance with a fourth embodiment of the present application.
FIG. 5 is a cross sectional view of a SOT MRAM device in accordance with a fifth embodiment of the present application.

In some embodiments of the present application, each of the plurality of via structures 30 (the via structures can also be labeled as $V_{x-1}$ as shown in FIGS. 4 and 5) is composed of an electrically conductive metal or metal alloy. Illustrative examples of electrically conductive materials that can be used in providing the via structures 30 include, but are not limited to, Cu, Al, Cu—Al alloy, W, Ru, or Rh. In other embodiments the plurality of via structures 30 are composed of a topological conductor (as will be described herein below). In some embodiments, the via structures 30 can be replaced by a via portion that is present in the SOT layer 32X and each of the interconnect layers 32Y and 32Z that are present in the structure.

In some embodiments, a diffusion barrier liner (not shown) can be present along at least a sidewall (and in some embodiments along a bottom wall) of each of the plurality of via structures 30. When present, the diffusion barrier liner can be composed of any well-known diffusion barrier material such as, for example, Ta, TaN, Ti, TiN, W or WN. In some embodiments, the diffusion barrier liner can include a material stack of two or more diffusion barrier materials. In one example, the diffusion barrier liner can be composed of a stack of Ta/TaN or a stack of Ti/TiN.

The plurality of interconnect layers 32Y and 32Z, and the at least one SOT layer 32X that are present in a first interconnect dielectric layer ILD1 are all composed of compositionally same topological conductor. In embodiments of the present application, the topological conductor that provides each of the interconnect layers 32Y and 32Z, and the at least one SOT layer 32X is compositionally the same as, or compositionally different from, the topological conductor that can be used in certain embodiments of the present application to provide the via structures 30. The term "topological conductor" is used herein to define a conducting material (i.e., a topological metal or a topological semimetal) whose nontrivial bulk bandstructure topology guarantees the existence of conducting surface states with suppressed carrier scattering, such that the surface conductivity is much greater (2× or more) than the bulk (i.e., the portion of the material that is beneath a surface of the material) conductivity of the material. The topological conductors typically have high charge-to-spin current conversion efficiency, and thus, they are good spin-current sources and can be used as a SOT material.

In the present application, topological conductors (i.e., topological metals or topological semimetals) that can be used are categorized according to the dimensionality of their band crossings and their band degeneracies at the band crossings. Topological conductors with 0D band crossings include Weyl semimetals and multifold-fermion semimetals. The former has a 2-fold band degeneracy, while the latter can have 3-, 4-, 6-, or 8-fold band degeneracies at the nodes. Non-magnetic, non-centrosymmetric Weyl semimetals include TaAs, TaP, NbAs, NbP, (Mo,W)Te$_2$, LaAlGe, and TaIrTe$_4$. Magnetic Weyl semimetals include Co$_3$Sn$_2$S$_2$, Mn$_{3+x}$Sn$_{1-x}$, EuCd$_2$As$_2$, RAlGe (where R is a rare earth metal), and PrAlGe. The multifold-fermion semimetals include CoSi, RhSi, CoGe, RhGe, and AlPt. Double-Weyl fermions can also be used in some embodiments of the present application.

Weyl nodes and Fermi arcs also exist in non-magnetic chiral crystals with relevant spin-orbit coupling. Candidates of these so-called Kramers-Weyl fermion topological semimetals include Ag$_3$BO$_3$ (SG-156), T1Te$_2$O$_6$ (SG-150), Ag$_2$Se (SG-19), etc., where SG=space group.

Topological conductors with 1D band crossings are called topological nodal-line semimetals. These semimetals include Co$_2$MnGa, and XY$_4$ crystals (X=Ir, Ta, Re; Y=F, Cl, Br, I) with lattices formed of octahedra, similar to IrF$_4$.

Besides the topological materials described above, there is yet another distinct type of topological conductor that can be employed—triple-point topological metals. They feature topologically protected Weyl nodes of three bands, two of which are degenerate along a high-symmetry direction in the Brillouin zone. They are distinct from the topological semi-metals in that the band gap between the conduction and the valence bands closes along this high-symmetry line. Examples of triple-point topological metals include WC, MoC, MoP, MON, ZrTe, etc.

Unlike topological insulators, topological conductors have a much higher carrier density at the Fermi level and also high carrier mobility, enabling high current-carrying capacity. As the dimension of the topological semimetal scales below approximately 10 nm, carrier transport via the Fermi-arc states becomes pronounced, potentially dominating over the bulk-state transport. Depending on the types of impurity scattering and the type of topological semi-metals, significant surface-state transport may persist up to approximately 100 nm.

Electron transmission via the Fermi-arc states are robust against defects and impurities if the film thickness exceeds the material-dependent threshold value, e.g., approximately 2.5 nm in CoSi, which ensures high mobility for Fermi-arc surface electrons, even at exceedingly small thicknesses. Additionally, the scattering of bulk electrons is generally suppressed because the multiple bands that cross the Weyl nodes are orthogonal to each other, which ensures high mobility for bulk-state electrons near the Weyl nodes. These considerations mean that topological conductors with (1) a high Chern number, (2) many pairs of Weyl nodes, and (3) very few or no topologically trivial bulk bands near the Fermi level are preferred materials for applications.

As an example, the Weyl semimetal NbAs has shown a lower resistivity (1-5 $\mu\Omega$-cm) at the sub-micron scale than its bulk resistivity (approximately 35 $\mu\Omega$-cm), enabling potentially greater than 50% resistance-capacitance product (RC) reductions at 5 nm node dimensions. Extremely low resistivity is also observed in topological metal MoP ($^-9$ n$\Omega$-cm at 2 K and 8.2 $\mu\Omega$-cm at 300 K). As a comparison, Cu bulk resistivity is approximately 2 $\mu\Omega$-cm, increasing to approximately 15 $\mu\Omega$-cm at the 15-18 nm scale.

As discussed above, the topological conductors that can be used in the present application include, but are not limited to, Weyl semimetals NbAs, TaAs, NbP, TaP, (Mo,W)Te$_2$ etc.; multi-fold fermion systems RhSi, CoSi etc., magnetic Weyl semimetals Co$_3$Sn$_2$S$_2$, Mn$_{3+x}$Sn$_{1-x}$, PrAlGe etc.; Kramers-Weyl fermions Ag$_2$Se etc., and triple-point topological metals MoP, WC, etc.

The structure illustrated in FIG. 1 further includes a MTJ structure 38P located in the memory device region A1. The MTJ structure 38P forms an interface with the SOT layer 32X. The MTJ structure 38P is a patterned magnetic material-containing stack that includes a magnetic free layer, a tunnel barrier layer, a magnetic reference layer, and an electrode layer. Other magnetic and non-magnetic layers can be present in the patterned magnetic material-containing stack that provides the MTJ structure 38P. In some embodiments, the patterned magnetic material-containing stack that provides the MTJ structure 38P includes, from bottom to top, the magnetic free layer, the tunnel barrier layer, the magnetic reference layer, and the electrode layer. In other embodiments, the patterned magnetic material-containing stack that provides the MTJ structure 38P includes, from bottom to top, the electrode layer, the magnetic reference layer, the tunnel barrier layer, and the magnetic free layer; this embodiment would require complete inversion of the memory structure such that the SOT layer 32X is located above the MTJ structure 38P. In the present application, the magnetic free layer of the MTJ structure 38P forms an interface with the SOT layer 32X.

The magnetic free layer is composed of at least one magnetic material with a magnetization that can be changed in orientation relative to the magnetization orientation of the magnetic reference material. Exemplary magnetic materials for the magnetic free layer include, but are not limited to, alloys and/or multilayers of cobalt, iron, alloys of cobalt-iron, nickel, alloys of nickel-iron, and alloys of cobalt-iron-boron. The magnetic free layer can have a thickness from 0.3 nm to 3 nm; although other thicknesses are possible and can be used as the thickness of the magnetic free layer.

The tunnel barrier layer includes a tunnel barrier material. The tunnel barrier material is formed at such a thickness as to provide an appropriate tunneling resistance. The tunnel barrier material that can be employed in the present application includes but is not limited to, magnesium oxide, aluminum oxide, and titanium oxide, or materials of higher electrical tunnel conductance, such as semiconductors or low-bandgap insulators. The thickness of the tunnel barrier layer will depend on the material selected. In one example, the tunnel barrier layer can have a thickness from 0.5 nm to 1.5 nm; although other thicknesses are possible as long as the thickness of the tunnel barrier layer provides an appropriate tunneling resistance.

The magnetic reference layer is composed of a magnetic material that has a fixed magnetization. The magnetic material that provides the magnetic reference layer is composed of a metal or metal alloy that includes one or more metals exhibiting high spin polarization. In alternative embodiments, exemplary metals for the formation of the magnetic reference layer include iron, nickel, cobalt, chromium, boron, and manganese. Exemplary metal alloys may include the metals exemplified by the above. In another embodiment, the magnetic reference layer may be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gado-linium, cobalt-chromium-platinum, cobalt-platinum, cobalt-palladium, iron-platinum, and/or iron-palladium. The alloys may be arranged as alternating layers. In one embodiment, combinations of these materials and regions may also be employed. In another embodiment, combinations of these materials and regions may form synthetic antiferromagnetic layers to pin the magnetization of the magnetic reference layer. The magnetic reference layer can have a thickness from 0.3 nm to 30 nm; although other thicknesses are possible and can be used as the thickness of the magnetic reference layer.

The electrode layer is composed of an electrically conductive material such as, for example, Ta, TaN, Ti, TiN, Ru, RuN, RuTa, RuTaN, Co, CoWP, CON, W. WN or any combination thereof. The electrode layer can have a thickness from 5 nm to 100 nm; other thicknesses are possible and can be used in the present application as the thickness of electrode layer.

The MTJ structure 38P can be formed by deposition and patterning. The deposition includes one or more deposition processes including, but not limited to, CVD, PECVD, PVD, atomic layer deposition (ALD) including plasma enhanced ALD, or sputtering. The patterning can include reactive ion etching or electron beam etching (IBE).

The structure illustrated in FIG. 1 can further include an encapsulation liner 40L located on ILD1 and laterally surrounding the MTJ structure 38P. The encapsulation liner 40L includes one of the dielectric materials mentioned above for the dielectric capping layer 19. The encapsulation liner 40L can be formed by deposition of the dielectric material, followed by removing the dielectric material that provides the encapsulation liner 40L that is formed on top of the MTJ structure 38P. The removal of this dielectric material that is formed on top of the MTJ structure 38P can be performed during the formation of contact structures 44B and 44D.

The structure illustrated in FIG. 1 further includes contact structures 44B and 44D. In some embodiments and as shown in FIGS. 3, 4 and 6K, contact structures 44A and 44C can also be formed. Contact structure 44B provides an upper metal level contact to the MTJ structure 38P; thus contact structure 44B can be referred herein as a MTJ contact structure. Contact structure 44B forms an interface with MTJ structure 38P. Contact structures 44D provide an upper metal level contact to the interconnect layer 32Z that is present in the non-memory device region. Contact structure 44D can be referred to as a non-memory interconnect contact structure.

When contact structure 44A is present, contact structure 44A provides an upper metal level contact to the SOT layer 32X that is formed in the memory device region, A1. Thus, contact structure 44A can be referred herein as a SOT contact structure. In some embodiments, the contact structure 44A (i.e., the SOT contact structure) includes a via portion, $V_{x+1}$, which is filled with the same material as the contact structure 44A. In such embodiments, the via portion, $V_{x+1}$ of the contact structure 44A forms an interface with the SOT layer 32X (see, for example, FIGS. 5 and 6K). In other embodiments, a via structure 31 composed of a different electrically conductive material than the contact structure 44A forms an interface with the SOT layer 32X (see, for example, FIG. 3).

When contact structure 44C is present, contact structure 44C provides an upper metal level contact to the interconnect layer 32Y that is formed in the non-memory device region, A2 (see, for example, FIG. 6K). Thus, contact structure 44C can be referred to here as an interconnect contact structure. In FIG. 6K, the contact structure 44C includes a via portion, $V_{x+1}$. The via portion, $V_{x+1}$ can be composed of a same or different material than the contact structure 44C.

In the present application, the contact structures 44A, 44B, 44C and 44D are composed of an electrically conductive metal, electrically conductive metal alloy or topological conductor as described above. The topological conductor that provides the contact structures 44A, 44B, 44C and 44D can be compositionally the same as, or compositionally different from, the topological conductor that provides the interconnect layers 32Y, 32Z and the SOT layer 32X. In the embodiments, each via portion, $V_{x+1}$, can be composed of a compositionally same or compositionally different material selected from one of an electrically conductive metal, electrically conductive metal alloy or topological conductor as described above. In the embodiment that includes second via structure 31, second via structure 31 can be composed of a compositionally different material than the overlying and connected electrically conductive structure. For example, contact structure 44A can be composed of a topological conductor, while second via structure 31 is composed of Cu. Each contact structures 44A, 44B, 44C and 44D is formed utilizing a metallization process.

The structure of FIG. 1 further includes a second interconnect dielectric layer ILD2. The second ILD layer ILD2 includes at least one of the dielectric materials mentioned above for the first interconnect dielectric layer ILD1. The second interconnect dielectric layer ILD2 embeds at least a portion of each of the electrically conductive contact structures 44A, 44B, 44C and 44D. The second interconnect dielectric layer ILD2 is formed by a deposition process such as, for example, CVD, PECVD, ALD or spin-on-containing. In the present application, the second interconnect dielectric layer ILD2 is typically formed prior to forming the contact structures 44A, 44B, 44C and 44D.

In summary, the structure illustrated in FIG. 1 includes memory device region, A1. including memory structure located therein, the memory structure includes SOT layer 32X and interconnect layer 32Y located at a same metal level of a BEOL structure, wherein both the SOT layer 32X and the interconnect layer 32Y are composed of a topological conductor, a MTJ structure 38P is located on the SOT layer 32X, and a MTJ contact structure 44B is located on the MTJ structure 38P. In addition to the memory device region, A1, the structure also includes a non-memory device region, A2, located adjacent to the memory device region, A1. The non-memory device region, A2, includes another interconnect layer 32Z, wherein the another interconnect layer 32Z is located at the same metal level as both the SOT layer 32X and the interconnect layer 32Y, and the another interconnect layer 32Z is composed of the topological conductor.

Reference is now made to FIGS. 2-5, which illustrate other SOT MRAM devices in accordance with the present application which can be used as a replacement for the SOT MRAM device shown in FIG. 1. Notably, the SOT MRAM device illustrated in FIG. 2 includes SOT layer 32X, via structures 30 located beneath the SOT layer 32X, MTJ structure 38P located on top of the SOT layer 32X, contact structure 44B located on the MTJ structure 38P, contact structure 44A located on one side of the MTJ structure 38P and a via structure 31 connecting contact structure 44A to the SOT layer 32X. The SOT MRAM device illustrated in FIG. 3 includes SOT layer 32X, MTJ structure 38P located on top of the SOT layer 32X, contact structure 44B located on the MTJ structure 38P, contact structures 44A located on each side of the MTJ structure 38P, and via structures 31 electrically connecting each contact structure 44A to the SOT layer 32X. The SOT MRAM device illustrated in FIG. 4 includes SOT layer 32X having via portions $V_{x-1}$. Here SOT layer 32X and the via portions $V_{x-1}$ are of unitary construction and are composed of a same topological conductor. The SOT MRAM device illustrated in FIG. 4 further includes MTJ structure 38P located on top of the SOT layer 32X and contact structure 44B located on the MTJ structure 38P. The SOT MRAM device illustrated in FIG. 5 is similar to the SOT MRAM device shown in FIG. 3 except that via structures 31 are replaced with via portions, $V_{x+1}$. Here the electrical contact structure 44A and the via portions $V_{x+1}$ are of unitary construction and are composed of a same material, i.e., electrically conductive metal, electrically conductive metal alloy or topological conductor as mentioned above.

Figures 6A, 6B, 6C, 6D:
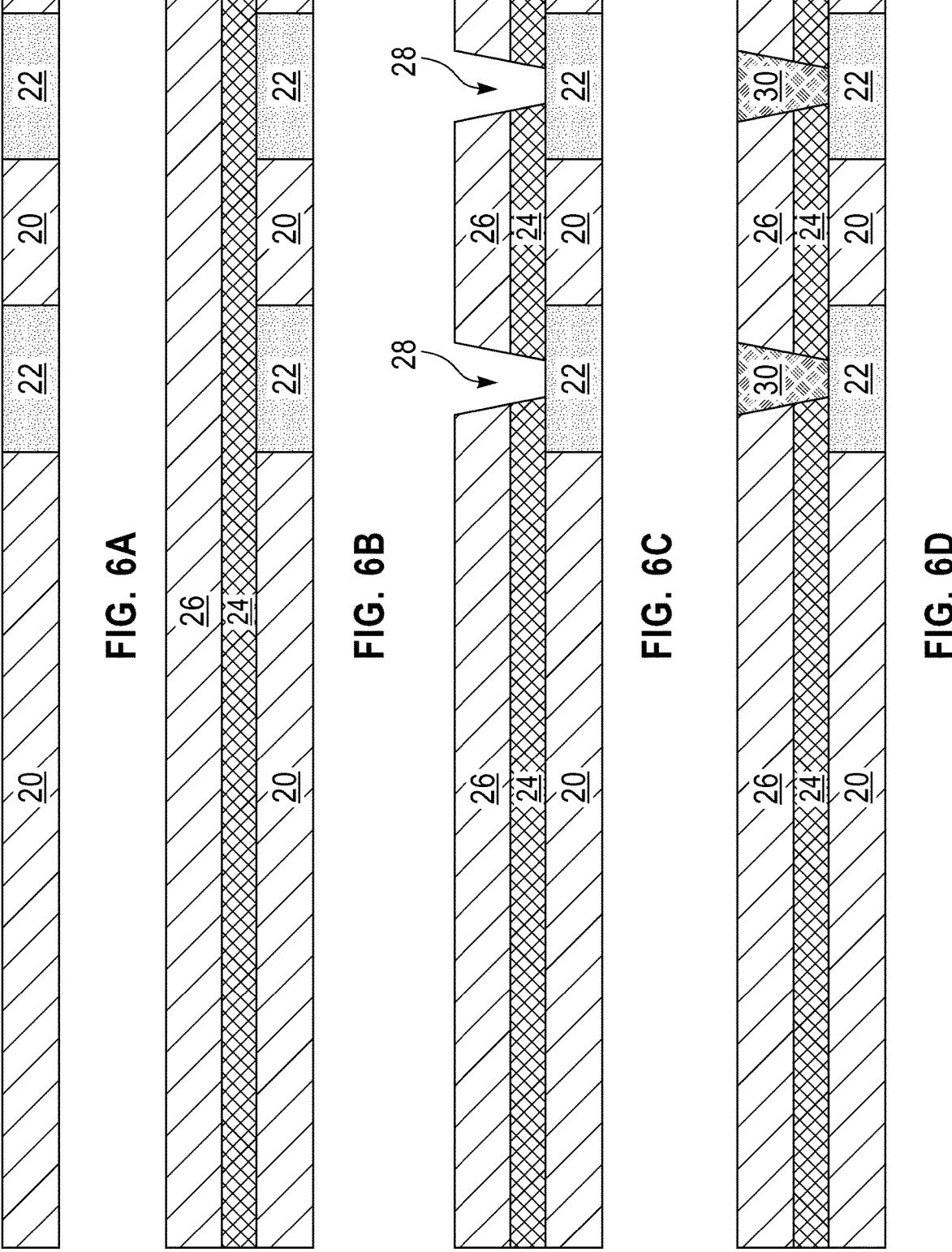
FIGS. 6A-6K are cross sectional views of a method that can be used in forming a SOT MRAM device in accordance with an embodiment of the present application.
Figures 6E, 6F, 6G:
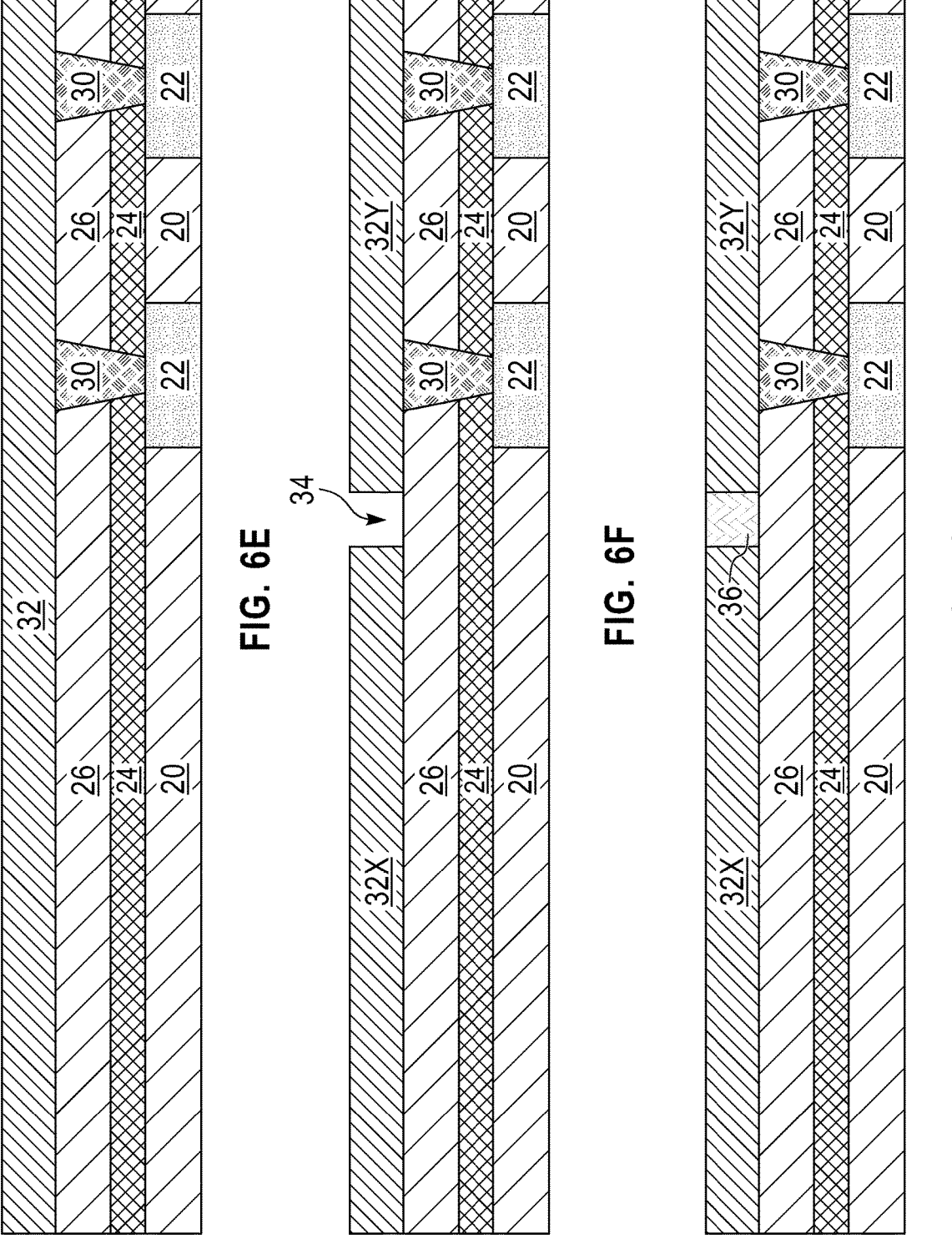
Figure 6H:
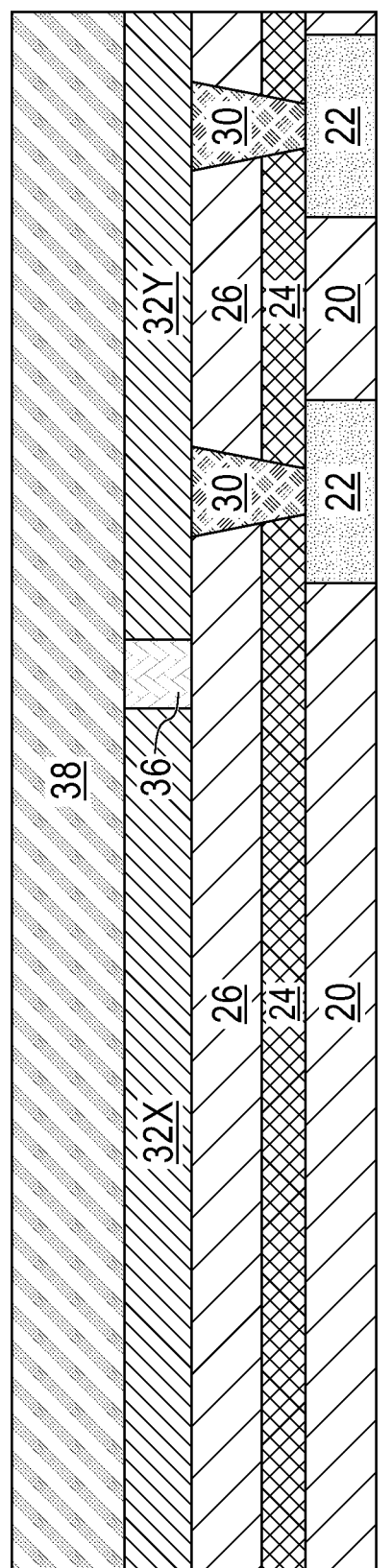
Figure 6I:
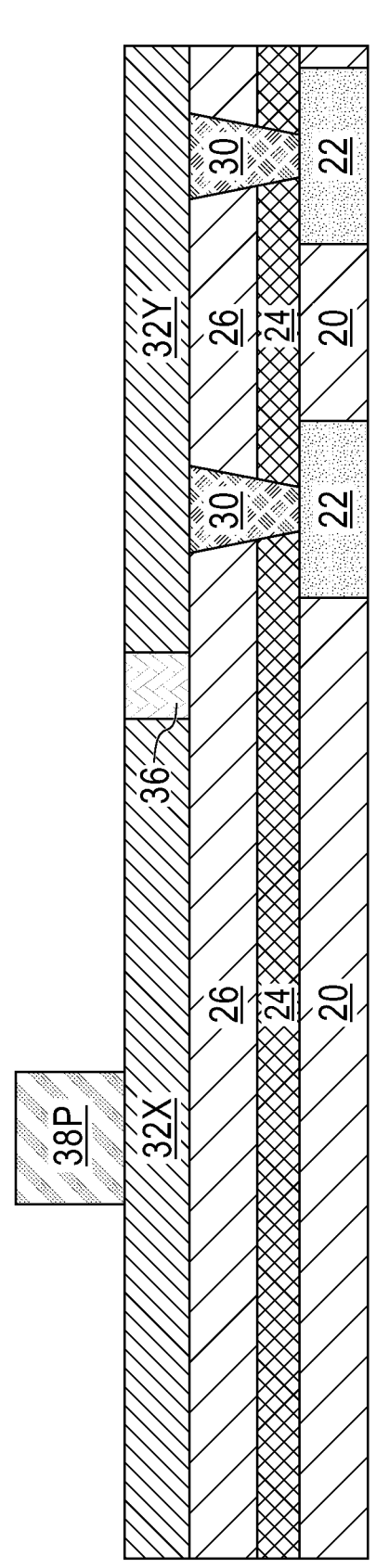
Figure 6J:
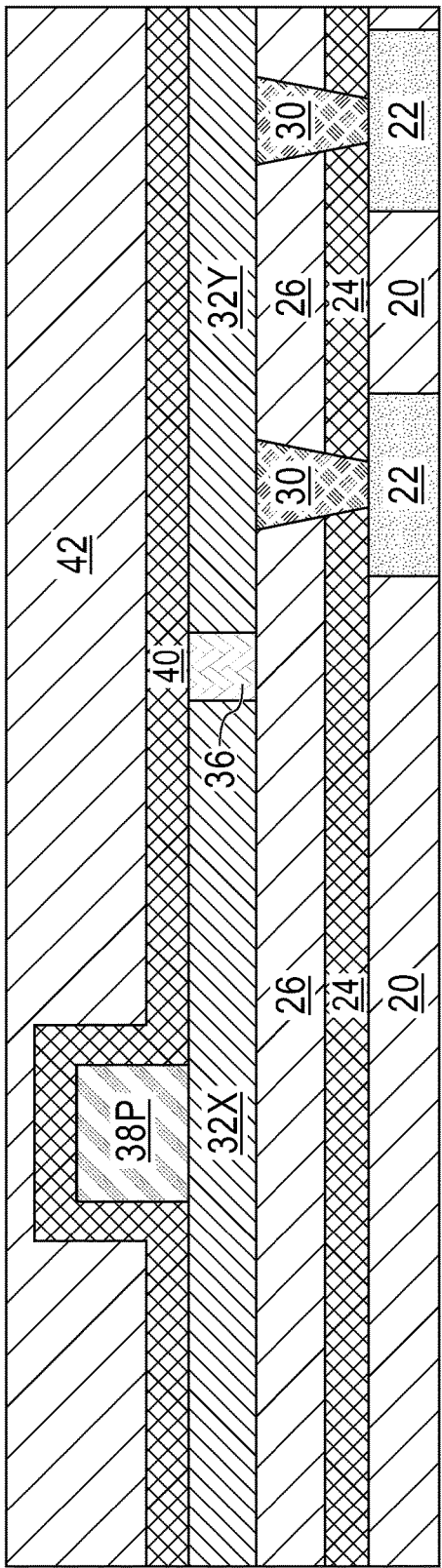
Figure 6K:
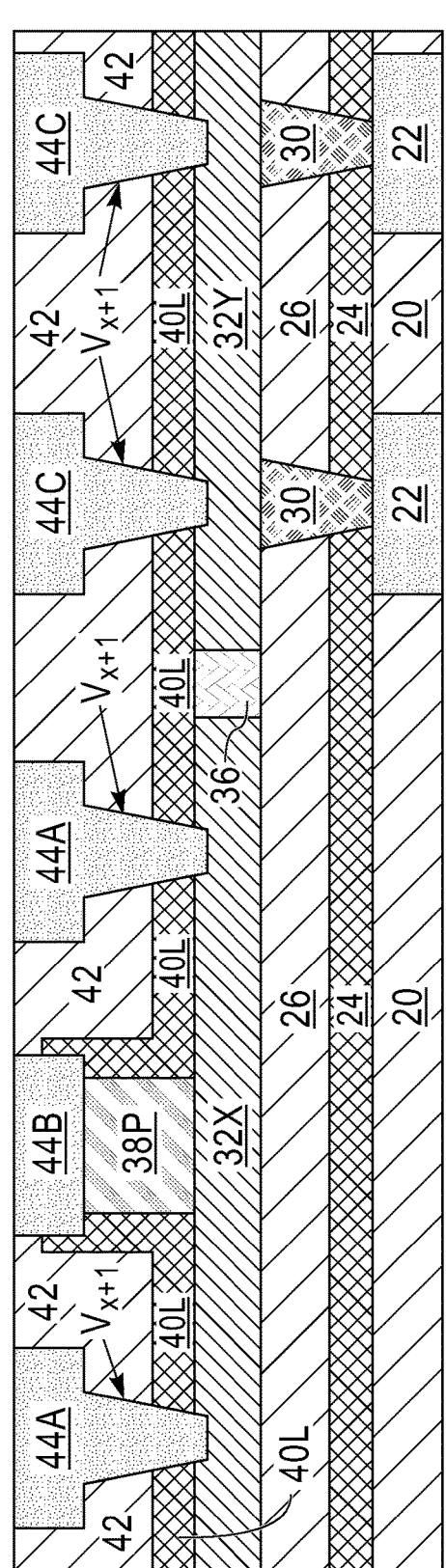

Referring now to FIGS. 6A-6K, there are illustrated a method that can be used in forming a SOT MRAM device in accordance with an embodiment of the present application. The method illustrated in FIGS. 6A-6K is only within the memory device region, A1 depicted in FIG. 1. Referring first to FIG. 6A, there is illustrated an exemplary interconnect level that can be employed in the present application. Notably, FIG. 6A illustrates an interconnect level including at least one first electrically conductive structure 22 (two of which are illustrated in FIG. 6A by way of one example) embedded in a first interconnect dielectric layer 20.

The first dielectric layer 20 can be composed of one of the interconnect dielectric materials mentioned above for ILD1. The first dielectric layer 20 can be formed by a deposition process such as, for example, CVD, PECVD, ALD, sputtering or spin-on coating. The first dielectric layer 20 can have a thickness from 50 nm to 250 nm. Other thicknesses that are lesser than 50 nm, and greater than 250 nm can also be employed in the present application as the thickness of the first interconnect dielectric layer 20.

The first electrically conductive structures 22 can be composed of an electrically conductive metal, an electrically conductive metal alloy, or a topological conductor. In some embodiments, a diffusion barrier liner (not shown) can be present along at least a sidewall (and in some embodiments along a bottom wall) of the via structures 22. The diffusion barrier liner includes one of diffusion barrier materials mentioned previously.

The exemplary structure shown in FIG. 6A can be formed by first depositing the first dielectric layer 20. The first deposition can include, for example, CVD, PECVD, ALD, sputtering or spin-on coating. Next, at least one contact opening is formed into the first dielectric layer 20 by lithography and etching. Lithography includes forming a photoresist material on a surface of a material layer or structure that needs to be patterned, exposing the deposited photoresist material to a pattern of irradiation and thereafter developing the exposed photoresist material. The etching used in providing the at least one contact opening into the first dielectric layer 20 can include a dry etching process (i.e., reactive ion etching, plasma etching or ion beam etching) or a chemical wet etch. Next, and if present, a layer of diffusion barrier material can be formed in the at least one via opening and atop the first dielectric layer 20. The forming of the layer of diffusion barrier material includes a deposition process such as, for example, CVD, PECVD, physical vapor deposition (PVD) or atomic layer deposition (ALD). The layer of diffusion barrier material does not fill in an entirety of the at least one contact opening. Next, one of the above mentioned electrically conductive materials (e.g., Cu) is then deposited on the layer of diffusion barrier material. The deposition of the electrically conductive material can include CVD, PECVD, PVD, ALD, sputtering or plating. A planarization process such as, for example, chemical mechanical polishing (CMP), is then performed to remove the layer of diffusion barrier material (if the same is present) and the electrically conductive material or topological semimetal that is formed outside of the at least one opening and on top of the first dielectric layer 20. The electrically conductive material and, if present, the layer of diffusion barrier material remain in the opening after the planarization process. The electrically conductive material that remains in the opening provides the at least one first electrically conductive structure 22 and, if present, the diffusion barrier material layer that remains in the opening provides the diffusion barrier liner (not shown in FIG. 6A). In embodiments of the present application, the at least one first electrically conductive structure 22 has a topmost surface that is coplanar with at least a topmost surface of the first interconnect dielectric layer 20; if a diffusion barrier liner is present, the topmost surface of the at least one first electrically conductive structure 22 can also be coplanar with a topmost surface of the diffusion barrier layer as well as with a topmost surface of the first dielectric layer 20.

Referring now to FIG. 6B, there is illustrated the interconnect level shown in FIG. 6A after forming a dielectric capping material layer 24 and a second dielectric layer 26 on top the interconnect level. As is shown, the dielectric capping material layer 24 is located on both the first dielectric layer 20 and the at least one electrically conductive structure 22, while the second dielectric layer 26 is located on the dielectric capping layer 24. In some embodiments (not shown), the dielectric capping layer 24 can be omitted from being formed.

When present, the dielectric capping layer 24 includes one of the dielectric materials mentioned above for dielectric capping layer 19. The dielectric material that provides the dielectric capping layer 24 can have a thickness from 10 nm to 200 nm. Other thicknesses are possible and can be employed as the thickness of the dielectric material that provides the dielectric capping layer 24. The dielectric capping layer 24 can be formed utilizing a deposition process such, as, for example, CVD, PECVD, ALD, sputtering or spin-on coating.

The second dielectric layer 26 that can be formed directly on either the dielectric capping layer 24 (if the same is present, or on the interconnect level shown in FIG. 6A (if the dielectric capping layer 24 is not present), includes one of the dielectric materials mentioned above for ILD 1. The dielectric material that provides the second dielectric layer 26 can be compositionally the same as, or compositionally different from, the dielectric material that provides the first interconnect dielectric layer 20. The dielectric material that provides the second dielectric layer 26 is compositionally different from the dielectric capping layer 24. The second dielectric layer 26 can be formed utilizing a deposition process such as, for example, CVD, PECVD, ALD, sputtering or spin-coating. The second dielectric layer 26 can have a thickness within the thickness range mentioned above for the first dielectric layer 20.

Referring now to FIG. 6C, there is illustrated the exemplary structure shown in FIG. 6B after forming at least one via opening 28 (two of which are shown by way of one example in FIG. 6C) into the dielectric material stack of the second dielectric layer 26 and the dielectric capping layer 24. As is shown, each via opening 28 physically exposes a surface of an underlying first electrically conductive structure 22. The at least one via opening 28 can be formed by lithography and etching. A cleaning step can be used to clean the physically exposed surface of the underlying metal-containing structure.

Referring now to FIG. 6D, there is illustrated the exemplary structure shown in FIG. 6C after forming a via structure 30 in each of the via openings 28. In some embodiments and in addition to a via structure 30, a diffusion barrier liner (not shown) can be present in each of the via openings 28. When a diffusion barrier liner is present, the diffusion barrier liner is present along a sidewall and a bottom wall of the via structure 30. The via structures 30 includes one of the electrically conductive metals or metal alloys mentioned above for the at least one first electrically conductive structure 22, and the optional diffusion barrier liner includes one of the diffusion barrier materials mentioned above. In some embodiments, the via structures 30 are composed of a topological conductor as defined above. The via structures 30 can be formed utilizing the metallization process (deposition, followed by planarization) as mentioned above in forming the first electrically conductive structure 22. Each via structure 30 has a topmost surface that is typically coplanar with at least a topmost surface of the second interconnect dielectric layer 26.

Referring now to FIG. 6E, there is illustrated the exemplary structure shown in FIG. 6D after forming a topological conductor layer 32. As is shown, the topological conductor layer 32 is formed on a physical exposed topmost surface of the second interconnect dielectric layer 26 and a physically exposed topmost surface of each via structure 30. The topological semimetal conductor 32 includes one of the topological materials mentioned above. The topological conductor layer 32 can be formed utilizing a deposition process such as, for example, CVD. PECVD, ALD, sputtering or molecule beam epitaxy (MBE). In one example, topological conductor layer 32 is composed of CoSi which can be sputtered from a Co—Si target at a temperature between 250° C. and 550° C. The topological conductor layer 32 can have a thickness from 3 nm to 50 nm. Other thicknesses that are lesser than 3 nm, and greater than 50 nm can also be employed in the present application as the thickness of the topological conductor layer 32.

Referring now to FIG. 6F, there is illustrated the exemplary structure shown in FIG. 6E after patterning the topological conductor layer 32 to having an opening 34 that physically exposes a surface of the underling second dielectric layer 26. Opening 34 can be formed by lithography and etching. In the present one of the remaining (non-etched) portions of the topological conductor layer 32 which is not located over the via structures 30 will serve as SOT layer 32X, while the other remaining portion of the topological conductor layer 32 which is located over the via structures 30 will serve as an interconnect layer 32Y. The SOT layer 32X and the adjacent interconnect layer 32Y which are composed of a same topological conductor are located at a same metal level in the exemplary structure.

Referring now to FIG. 6G, there is illustrated the exemplary structure shown in FIG. 6F after forming a dielectric material plug 36 into opening 34. The dielectric material plug 36 separates a sidewall of the SOT layer 32X from a sidewall of the interconnect layer 32Y, and the dielectric material plug 36 is formed in direct physical contact with the underlying and previously physically exposed surface of the second dielectric layer 26. The dielectric material plug 36 includes a dielectric material that can be compositionally the same as, or compositionally different from the dielectric material that provides the second dielectric layer 26. Typically, the dielectric material that provides the dielectric material plug 36 is compositionally the same as the dielectric material that provides the second dielectric layer 26. The dielectric material plug 36 can be formed by deposition (e.g., CVD, PECVD, ALD or spin-on coating) of a dielectric material, followed by a planarization process. A sputter clean can follow the planarization process. The dielectric material plug 36 typically has a topmost surface that is coplanar with a topmost surface of both the SOT layer 32X and the interconnect layer 32Y.

Referring now to FIG. 6H, there is illustrated the exemplary structure shown in FIG. 6G after forming a magnetic material-containing stack 38 including a blanket layer of a magnetic free layer material, a blanket layer of a tunnel barrier material, a blanket layer of a magnetic reference layer material, and a blanket layer of an electrode material; the blanket layer of electrode material will subsequently be patterned and serve as an etch mask for the remaining blanket layers in this magnetic material-containing stack 38. It is noted that other magnetic and non-magnetic materials that are typically present in MTJ structures can be formed in the magnetic material-containing stack shown 38 in FIG. 6H.

Each of the magnetic free layer material, the tunnel barrier material, the magnetic reference layer material and the electrode material used here in forming the magnetic material-containing stack 38 have been described above in regard to the MTJ structure 38P shown in FIG. 1. The magnetic material-containing stack 38 described above, and as is illustrated in FIG. 6H, can be formed utilizing one or more deposition processes including, but not limited to, CVD, PECVD, PVD, ALD (including plasma enhanced ALD) or sputtering.

Referring now to FIG. 6I, there is illustrated the exemplary structure shown in FIG. 6H after patterning the magnetic material-containing stack 38 to provide a MTJ structure 38P. The MTJ structure 38P is located directly on a topmost surface of the SOT layer 32X. The MTJ structure includes remaining (i.e., non-patterned) portion of the magnetic material-containing stack 38 mentioned above. That is, the MTJ structure includes a remaining portion of the blanket layer of magnetic free layer material, a remaining portion of the blanket layer of tunnel barrier material, a remaining portion of the blanket layer of magnetic reference layer material, and a remaining position of the electrode material.

The patterning of the magnetic material-containing stack 38 includes a lithographic process in which a patterned resist (not shown) is formed on a topmost surface of top electrode material of the magnetic material-containing stack 38. The patterned resist can be formed by deposition of a photoresist material, exposing the photoresist material to a desired pattern of irradiation, and developing the exposed photoresist material. The patterned resist protects a portion of the blanket layer of electrode material, while leaving other portions of the blanket layer of top electrode material physically exposed. The physically exposed portions of the blanket layer of top electrode material are removed in an initial transfer etch. After the initial transfer etch, the patterned resist is removed utilizing a conventional resist removal process such as, for example, ashing. The patterning continues utilizing another etch in which the remaining portion of the electrode material serves as an etch mask for the remaining patterning process. This other etch stops on surface of the SOT layer 32X. This other etch removes remaining portions of the magnetic material-containing stack 38 that are not covered by the remaining portion of the top electrode material. The transfer etch and the subsequently performed etch can include ion beam etching, reactive ion beam etching or any combination thereof. The transfer etch can be the same as, or different from, the other etch used in this patterning step. For example, the transfer etch can include reactive ion etching, and the other etch can include ion beam etching.

In some embodiments of the present application, the exemplary structure shown in FIG. 6I can be subjected to an oxygen treatment process or any other gas treatment process or an etching process so as to remove any unwanted metallic particles that may have redeposited on the sidewalls of the MTJ structure 38P during this patterning.

Referring now to FIG. 6J, there is illustrated the exemplary structure shown in FIG. 6I after forming an encapsulation layer 40 and a third interconnect dielectric layer 42. The encapsulation layer 40 surrounds the MTJ structure 38P and is present on the SOT layer 32X, the dielectric material plug 36, and the interconnect layer 32Y. The encapsulation layer 40 includes one of the materials mentioned previously herein for encapsulation liner 40L. The encapsulation layer 40 can have a thickness from 3 nm to 200 nm. Other thicknesses are possible and can be employed as the thickness of the encapsulation layer 40.

The third dielectric layer 42 which is formed on the encapsulation layer 40 can include one of the dielectric materials mentioned above for ILD 1. The dielectric material that provides the third dielectric layer 42 can be compositionally the same as, or compositionally different from, the dielectric material that provides the first dielectric layer 20 and/or the second dielectric layer 26. The third dielectric layer 42 can be formed utilizing one of the deposition processes mentioned above for forming the first dielectric layer 20.

Referring now to FIG. 6K, there is illustrated the exemplary structure shown in FIG. 6J after forming contact structures 44A, 44B and 44C. In the present application, the contact structures 44A are in contact with a surface the SOT layer 32X, contact structure 44B is in contact with a surface of the MTJ structure 38P (typically contact is made with the remaining top electrode material portion of the MTJ structure 38P), and contact structures 44B are in contact with a surface of the interconnect layer 32Y. Each of the contact structures 44A, 44B and 44C can include a diffusion barrier liner as previous described above. Each of the contact structures 44A, 44B and 44C includes an electrically conductive metal, electrically conductive metal alloy or topological semimetal as described above. Each contact structures 44A, 44B and 44C is formed utilizing a metallization process as described above in forming first electrically conductive structure 22. As is shown in FIG. 6K, contact structures 44A and 44C include a via portion which is labeled as $V_{x+1}$.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A memory structure comprising:
a spin-orbit torque (SOT) layer and an interconnect layer located at a same metal level of a back-end-of-the-line (BEOL) structure, wherein both the spin-orbit torque (SOT) layer and the interconnect layer are composed of a topological conductor;
a magnetic tunnel junction (MTJ) structure having a magnetic free layer forming an interface with the SOT layer;
a MTJ contact structure contacting the MTJ structure; and
an encapsulation liner located along a sidewall of the MTJ structure and a sidewall of the MTJ contact structure, and in direct contact with both the SOT layer and the interconnect layer.

2. The memory structure of claim 1, wherein the topological conductor comprises a material selected from a metal or semimetal, wherein the metal or semimetal has band-structure protected conducting surface states with the surface conductivity that is greater than the bulk conductivity of the metal or semimetal.

3. The memory structure of claim 2, wherein the topological conductor comprises a Weyl semimetal, a multi-fold fermion semimetal, a magnetic Weyl semimetal, a Kramers-Weyl fermion semimetal or a triple-point topological metal.

4. The memory structure of claim 1, wherein the MTJ structure comprises, from bottom to top, the magnetic free layer, a tunnel barrier layer, a magnetic reference layer, and an electrode layer.

5. The memory structure of claim 1, wherein the MTJ structure comprises, from bottom to top, an electrode layer, a magnetic reference layer, a tunnel barrier layer, and the magnetic free layer.

6. The memory structure of claim 1, wherein the MTJ contact structure is composed of an electrically conductive metal, an electrically conductive metal alloy or another topological conductor.

7. The memory structure of claim 1, wherein the SOT layer and the interconnect layer are spaced apart by an interconnect dielectric layer.

8. The memory structure of claim 1, further comprising a SOT contact structure electrically connected to the SOT layer by a via structure.

9. The memory structure of claim 8, wherein the SOT contact structure comprises an electrically conductive metal, an electrically conductive metal alloy or another topological conductor, wherein the another topological conductor is compositionally the same as or compositionally different from the topological conductor that provides the SOT layer and the interconnect layer.

10. The memory structure of claim 1, further comprising a SOT contact structure electrically connected to the SOT layer by a via portion of the SOT contact structure.

11. The memory structure of claim 10, wherein the SOT contact structure comprises an electrically conductive metal, an electrically conductive metal alloy or another topological conductor, wherein the another topological conductor is compositionally the same as or compositionally different from the topological conductor that provides the SOT layer and the interconnect layer.

12. The memory structure of claim 1, further comprising at least one via structure contacting a bottommost surface of the SOT layer.

13. The memory structure of claim 12, wherein the at least one via structure is composed of an electrically conductive metal, electrically conductive material alloy or another topological conductor, wherein the another topological conductor is compositionally the same as or compositionally different from the topological conductor that provides the SOT layer and the interconnect layer.

14. The memory structure of claim 1, further comprising a via structure located beneath the interconnect layer.

15. The memory structure of claim 1, wherein the SOT layer is electrically connected to a source/drain region of a transistor.

16. A memory structure comprising:
a spin-orbit torque (SOT) layer and an interconnect layer located at a same metal level of a back-end-of-the-line (BEOL) structure, wherein both the SOT layer and the interconnect layer are composed of a topological conductor, wherein the SOT layer further comprises at least one via portion that is located on a side of the SOT layer that is opposite the side of the SOT layer that contacts the MTJ structure, the SOT layer and the at least one via portion are both composed of the topological conductor;
a magnetic tunnel junction (MTJ) structure having a magnetic free layer forming an interface with the SOT layer; and
a MTJ contact structure contacting the MTJ structure.

17. A structure comprising:

a memory device region comprising a memory structure located therein, the memory structure comprises a spin-orbit torque (SOT) layer and an interconnect layer located at a same metal level of a back-end-of-the-line (BEOL) structure, wherein both the spin-orbit torque (SOT) layer and the interconnect layer are composed of a topological conductor, a magnetic tunnel junction (MTJ) structure having a magnetic free layer forming an interface with the SOT layer, and a MTJ contact structure contacting the MTJ structure; and a non-memory device region located adjacent to the memory device region, the non-memory device region comprises another interconnect layer, wherein the another interconnect layer is located at the same metal level as both the SOT layer and the interconnect layer, and the another interconnect layer is composed of the topological conductor.

18. The structure of claim 17, wherein the topological conductor comprises a material selected from a metal or semimetal, wherein the metal or semimetal has bandstructure protected conducting surface states with the surface conductivity that is greater than the bulk conductivity of the metal or semimetal.

19. The structure of claim 18, wherein the topological conductor comprises a Weyl semimetal, a multi-fold fermion semimetal, a magnetic Weyl semimetal, a Kramers-Weyl fermion semimetal or a triple-point topological metal.

20. The structure of claim 17, wherein the SOT layer is electrically connected to a source/drain region of a transistor located in the memory device region, and the another interconnect layer is electrically connected to a source/drain region of a transistor located in the non-memory device region.

* * * * *